(12) United States Patent
Harashima et al.

(10) Patent No.: US 8,462,535 B2
(45) Date of Patent: Jun. 11, 2013

(54) MEMORY MODULE AND LAYOUT METHOD THEREFOR

(75) Inventors: Shiro Harashima, Tokyo (JP); Wataru Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/549,949

(22) Filed: Jul. 16, 2012

(65) Prior Publication Data

US 2012/0281348 A1   Nov. 8, 2012

Related U.S. Application Data

(63) Continuation of application No. 13/270,587, filed on Oct. 11, 2011, now Pat. No. 8,243,488, which is a continuation of application No. 12/638,382, filed on Dec. 15, 2009, now Pat. No. 8,054,664.

(30) Foreign Application Priority Data

Dec. 24, 2008   (JP) ................. 2008-328224

(51) Int. Cl.
*G11C 5/02* (2006.01)
(52) U.S. Cl.
USPC .............. 365/51; 365/230.08; 365/230.01; 365/189.05

(58) Field of Classification Search
USPC ............... 365/51, 230.08, 230.01, 189.05
See application file for complete search history.

(56) References Cited

U.S. PATENT DOCUMENTS

| | | |
|---|---|---|
| 2005/0166026 A1* | 7/2005 | Ware et al. ............ 711/167 |
| 2006/0059298 A1 | 3/2006 | Cho et al. |
| 2008/0101105 A1 | 5/2008 | Muff |

OTHER PUBLICATIONS

Harashima et al., U.S. Office Action mailed Mar. 21, 2011, directed to U.S. Appl. No. 12/638,382; 9 pages.

* cited by examiner

*Primary Examiner* — Thong Q Le
(74) *Attorney, Agent, or Firm* — Morrison & Foerster LLP

(57) ABSTRACT

The present invention provides a novel wiring method for LR-DIMM of VLP type that conforms to LR-DIMM technology. The LR-DIMM comprises a plurality of DRAMs mounted on a board, two connectors mounted on the board for receiving data, and a buffer device mounted on the board for redriving data applied to the two connectors to supply the data to the plurality of DRAMs. The buffer device is located near the center of the board on which the two connectors are arranged at both ends thereof, and supplies data from each connector to DRAMs arranged on the opposite side to the connector.

20 Claims, 13 Drawing Sheets

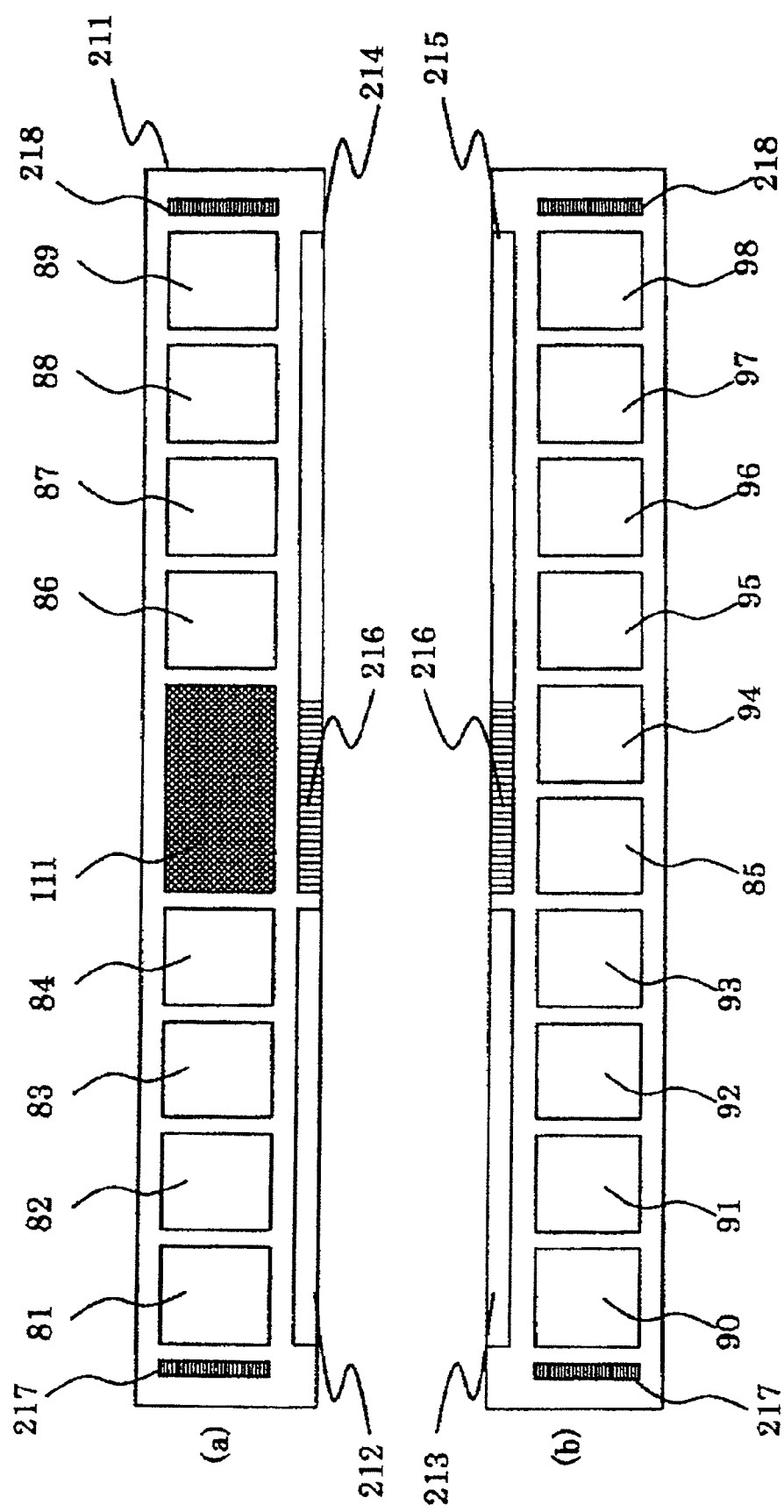

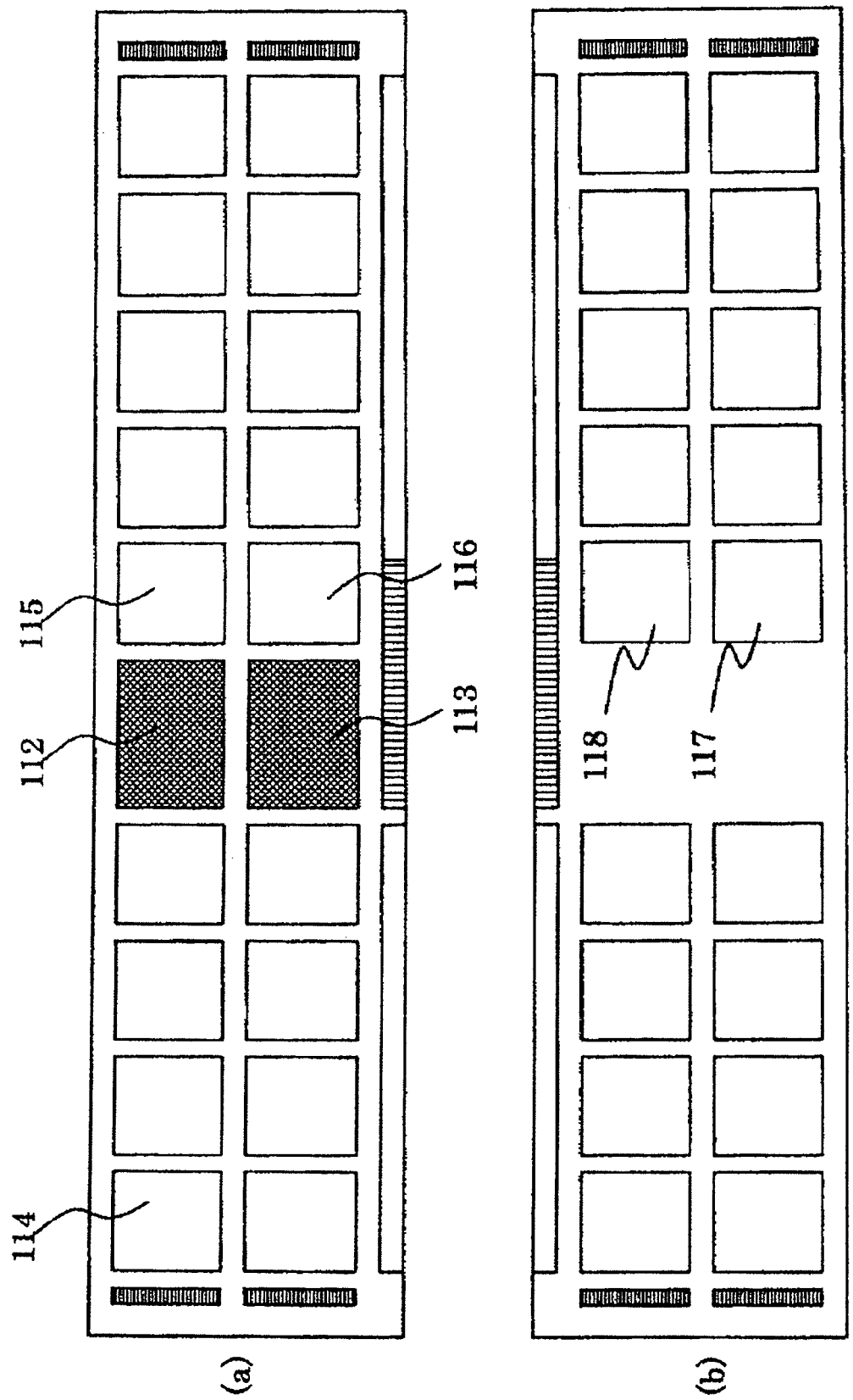

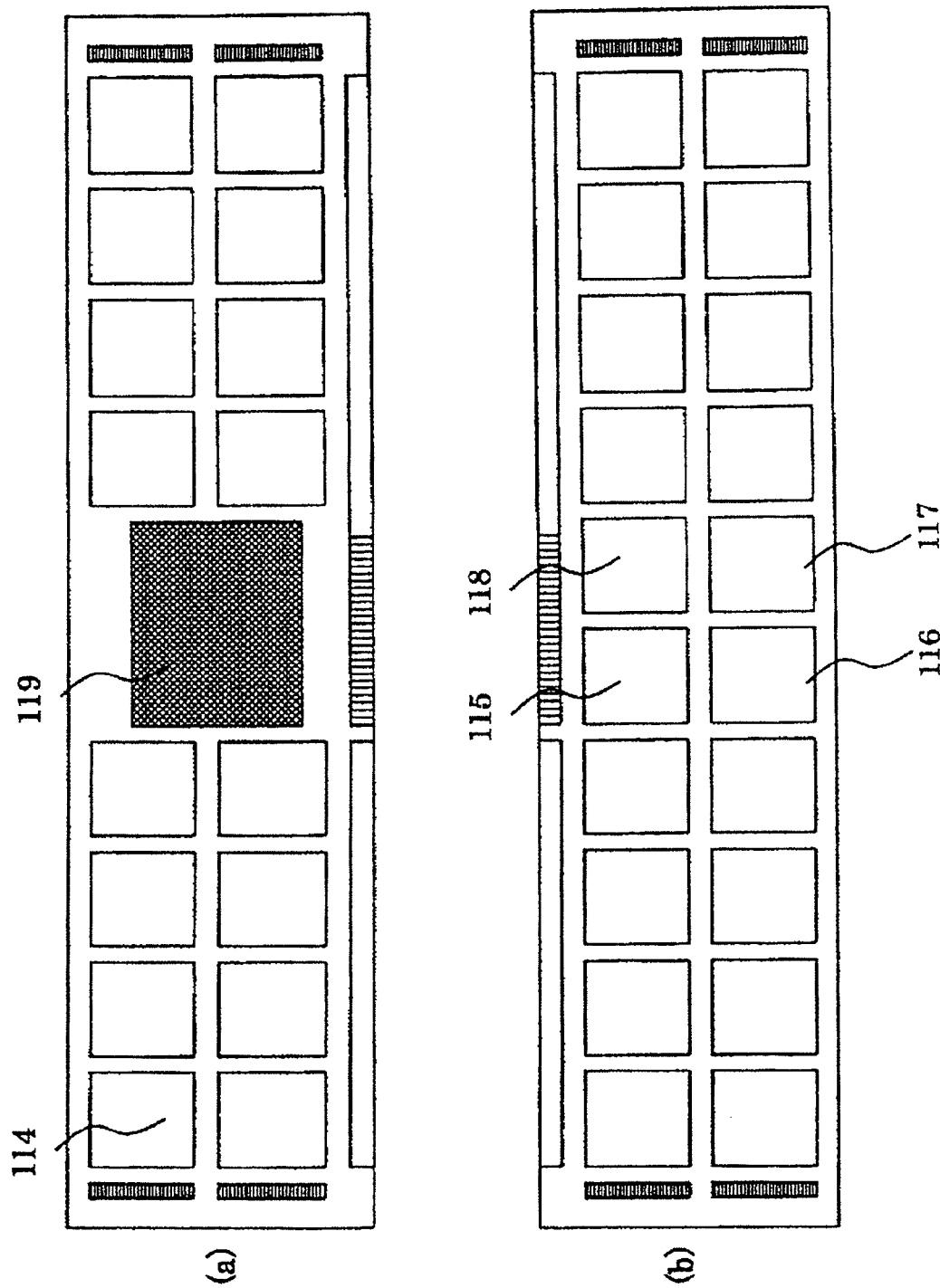

MEMORY MODULE AND LAYOUT METHOD THEREFOR

REFERENCE TO RELATED APPLICATIONS

This application is a continuation of U.S. patent application Ser. No. 13/270,587, filed Oct. 11, 2011, U.S. Pat. No. 8,243,488, which is a continuation of U.S. patent application Ser. No. 12/638,382, filed Dec. 15, 2009, U.S. Pat. No. 8,054,664, which claims the priority of Japanese Patent Application No. 2008-328224, filed Dec. 24, 2008, the contents of which prior applications are incorporated herein by reference.

BACKGROUND OF THE INVENTION

1. Field of the Invention

The present invention relates to a memory module and components thereof, and a wire layout method.

2. Description of the Related Art

In recent years, higher speeds have been difficult to achieve for large-capacity memory module products. A large capacity DRAM implies a problem in which it cannot be operated at high speeds due to an excessively large load capacity of the DRAM which is driven at one time, with respect to the length of wires from a memory controller to the DRAM, causing limitations to the trend of higher speeds sought for large-capacity products of memory systems, so that new technologies are required for seeking larger capacities and higher speeds for memory modules.

JEDEC (Joint Electron Device Engineering Council) Semiconductor Technology Association (hereinafter called "JEDEC") has discussed a technology referred to as LR-DIM (Load Reduce Dual Inline Memory Module) for seeking larger capacities and higher speeds. LR-DIMM is in a connector pin assignment of a connector for RDIMM (Registered Dual Inline Memory Module) which is mounted with a conventional DDR-SDRAM (Double Data Rate Synchronous Dynamic Random Access Memory).

RDIMM mounted with DDR3-SDRAM is generally referred to as DDR3-RDIMM, DDR3-Reg.DIMM or the like. In the following, DDR3-SDRAM is herein abbreviated simply as DRAM.

LR-DIMM includes RDIMM with a standard outer shape having a height of 18.75 mm, referred to as "VLP (Very Low Profile)-RDIMM," other than one with a JEDEC standard outer shape having a height of 30 mm, referred to as "LP (Low Profile)-RDIMM."

From the fact that VLP-RDIMM, due to its low-profile board, provides less space available for mounting parts as well as less space available for wiring on the board, as compared with LP-RDIMM, a high-level, high-density wiring technology, different from LP-RDIMM, is required for the new LR-DIMM technology.

For facilitating a description of LR-DIMM, DDR3-RDIMM will be briefly described with reference to FIG. 1 which shows the structure of RDIMM. DDR3-RDIMM will hereinafter be abbreviated as "RDIMM."

FIGS. 1(a), 1(b) are a plan view showing a first surface and a second surface, opposite to the first surface, of RDIMM, respectively. RDIMM comprises board 1 which is PCB (Printed Circuit Board), and DRAMs 10-27, register (buffering device) 28, connectors 2-6, and termination resistors 7, 8, which are provided on board 1.

Register 28 has a function of redriving a command, an address, a control signal, and a clock signal. While the example shown in FIG. 1 comprises one register 28, two such registers may be provided. Termination resistors 7, 8 provided at both ends of board 1 serve as terminations for signals redriven to register 28.

In FIG. 1, the numbers of DRAMs (10-27) and registers (28) are dominated by a laminated structure of the DRAMs and I/O configuration. The example shown in FIG. 1 is 1-Rank RDIMM with DIMM in an I/Ox72 configuration, which is mounted with 18 DRAMs each in an I/Ox4 configuration and one register 28.

1-Rank means that an associated RDIMM is controlled by a single chip select signal (CS signal) from a memory system. When RDIMM is controlled by two CS signals, it is classified into 2-Rank. When controlled by four CS signals, RDIMM is classified into 4-Rank.

Since the structure of the connectors has an important meaning in the present invention, a brief description will be given of the structure of the connectors. The connectors of RDIMM have 240 pins in total. A pin at the left-hand end, when a board is viewed from a first surface, is designated "pin 1," a pin at the right-hand end is designated "pin 120," and a pin at the back of the 1-pin on the second surface is designated "pin 240."

The connectors can be generally divided into connectors 2-5 which serve as a data section (DQ section); connector 6 which serves as a command, address, control signal and clock section (CA section); and another section including VSS, VDD, VTT, VREF, DQ, VREFCA, not shown.

FIGS. 2 and 3 are top plan views showing a wiring structure of RDIMM.

When board 1 is viewed from the first surface, there are 32 pins DQ[31:0], 8 pins CB[7:0], and data strobe signals (DQS) DQS[3:0], DQS[12:9], True/Bar of DQS 8 and DQS 17, for a total of 20 pins (not shown), in top and bottom connectors 2, 3 on the left side of connector 6 (CA section), so that there are a total of 60 signals.

When board 1 is viewed from the first surface, there are 32 pins DQ[63:32], and a True/Bar pins of DQS [7:4] and DQS [16:13], for a total of 16 (not shown), in connector terminals 4, 5 on the right side of connector 6 (CA section) on the top and bottom of board 1, i.e., there are a total of 48 signals. There are a total of 108 DQ and DQS signals on the left and right sides. CA signals include a total of 29, A[15:0], BA[2:0], #RAS, #CAS, #WE, CKE[1:0], ODT[1:0], #CS[n:0] (n=3 or 7), CLK, #CLK, Parity_in, #RESET, plus 4 or 8 signals. A series of DQ signals begins with the left end of the board on the top side, designated as DQ0, and runs toward the right end up to DQ63. CB[7:0] is positioned near the left side of connector 6 near the center of the board.

In conformity to the structure of the connectors, RDIMM has register 28 positioned above (near) connector 6 (CA), and DRAMs 10-27 positioned on both sides thereof. The DRAMs are not equal in number on the left and right sides of register 28, and particularly on the left side, DRAMs 14 and 23 are positioned in a central area of the board for receiving CB[7:0] for ECC (Error Check Correct). Also, DQ signals received by the DRAMs are assigned smaller numbers from the left-most DQ in accordance with the positional shifting of DQ terminals in connectors 2-5.

The wiring structure of RDIMM will be described with reference to FIGS. 2 and 3. First, the wiring structure for CA signals will be described with reference to FIG. 2. CA signal 29 input to register 28 is once redriven into register 28 and output therefrom. Output signals 30, 31 are transmitted, while daisy chaining the DRAMs (commonly referred to as "flyby"), through the respective DRAMs tied in a row, and are terminated at a terminal potential (VTT, not shown) through termination resistors 7, 8.

FIG. 2 shows some of the numerous DRAM connection methods.

Next, the wiring structure of DQ signals will be described with reference to FIG. 3. In FIG. 3, bi-directional DQ signals 33-41 are transmitted between connectors 2, 3, connectors 4, 5, and respective DRAMs 10-27. For DQ signals 33-41, DQ represents a bi-directional high-speed I/O interface. Here, DQ signal 33 represents a connecting situation of eight DQs, two DQSs, and two /DQSs ("/" represents an inverted input).

The RDIMM of this example is a 1-Rank RDIMM having an I/Ox4 configuration, where DQ[3:0], DQS0, and /DQS0 are connected to DRAM 10, and DQ[7:4], DQS9, and /DQS9 are connected to DRAM 19. As to DQ signals 34-41, four DQs, one DQS, and one /DQS are connected, respectively, to each DRAM in a similar manner.

Connectors 2 and 3 are connected to the DRAMs, by 40 DQs, 10 DQSs, and 10 /DQSs, represented by DQ group 32. Connectors 4 and 5 are connected to the DRAMs, by 32 DQs, 8 DQSs, and 8 /DQSs, represented by DQ group 33. The wiring structure of the RDIMM is generally as described above.

Next, LR-DIMM of VLP type will be described with reference to FIG. 4. FIGS. 4(a), 4(b) show plan views of LR-DIMM of VLP type, when viewed from a first surface and a second surface, opposite to the first surface, respectively.

In the first place, LR-DIMM is mounted with an LR buffer which has a function of redriving DQ as well together with the CA section, and is intended to drive a large-capacity DIMM at high speeds by redriving DQ signals from a system. The LR-DIMM shown in FIG. 4 is a 2-Rank DIMM which is mounted with laminated DRAMs having an I/Ox4 configuration.

In LR-DIMM shown in FIG. 4, connectors have the same shape as those of RDIMM. LR-DIMM comprises LR buffers 69, 70 for redriving DQ and CA signals. In LR-DIMM, the LR buffers cannot receive 108 DQ and DQS signals at one time due to the limitations of their PKG structure.

Each of LR buffers 69, 70 is configured to be capable of receiving 40 DQ signals and 20 DQS signals. Each LR buffer is capable of receiving all CA signals. LR buffer 69, 70 outputs signals redriven thereby in a one-to-one relationship with respect to the inputs. In FIG. 4, the LR buffers are mounted in a left region on the top of board 1 and in a right region on the bottom of board 1, respectively, and 18 DRAMS 51-68 are mounted on both sides of the LR buffers.

Wiring structures within the board of FIG. 4 will be described with reference to FIGS. 5 and 6. First, a wiring structure for CA signals will be described with reference to FIG. 5. First, CA signal 71 from connector 6 is once distributed to LR buffer 70, and then applied to LR buffer 69. This results in a timing shift in the CA signals which reach LR buffers 69, 70.

CA signal 71 applied to LR buffer 69, 70 is transmitted through the respective DRAMs tied in a row, in a manner similar to RDIMM, and is terminated to a termination potential (VTT, not shown) at termination register 7 or 8. FIG. 5 shows how CA signals 72, 73 output from LR buffers 69, 70 are transmitted through the DRAMs.

CA signal 73 which has passed through LR buffer 69 once travels to the end of board 1, turns back from there, passes through DRAMs 51 and 60→51 and 61→62→53 and 63→54 and 64→55, and is terminated at termination register 8. Likewise, CA signal 72 which has passed through LR buffer 70 once travels to the end of board 1, turns back from there, passes through DRAMs 59 and 68→58 and 67→57→56 and 66→65, and is terminated at termination resistor 7. As can be seen from the way DRAMs 51-68 are connected, CA signals 72, 73 are not uniform in load due to the difference between distances traveled thereby.

Next, a wiring structure for DQ signals is shown with reference to FIG. 6. Interfaces 74, 75 for transmitting DQ and DQS signals from connectors 2-5 are bi-directional high-speed I/O interfaces, similar to those of RDIMM. However, unlike RDIMM, DQ and DQS signals 74, 75 from the connectors are not directly connected to DRAMs, but are passed once through LR buffers 69, 70 which divide DQ and DQS signals 74, 75 into a set of four DQs, one DQS, and one /DQS, which is directed to each DRAM.

Among the DQ signals, DQ[31:0], CB[7:0] and DQS[3:0], DQS[12:9], DQS 8 and DQS 17 are applied to LR buffer 69, while DQ[32:63] and DQS[7:4], DQS[16:13] are applied to LR buffer 70. Connectors 2 and 3 are connected to LR buffer 69, by 40 DQs, 10 DQSs, and 10 /DQS, represented by DQ group 74. Connectors 4 and 5 are connected to LR buffer 70, by 32 DQs, 8 DQSs, and 8 /DQSs, represented by DQ group 75.

The LR-DIMM described above has the following problems.

1. The LR buffer requires long wiring paths for outputting CA signals. It is known that when the output of the LR buffer is followed by long aggregate wiring paths, a large ring-back generally occurs in a DRAM at a distal end, and this can be said to constitute a factor for degrading the reliability of transmission quality.

2. Allocated loads (DRAMs) are not uniformly distributed to CA signal outputs of the LR buffer. Discontinuity of loads causes discontinuity of execution characteristic impedance (which includes taking into consideration on the influence of a capacitive load placed on a wire added to characteristic impedance Zo originally exhibited by the wire. It is generally known that the capacitive load causes an impedance exhibited by a wire itself to be lower than its original value), which can constitute a factor for degrading the reliability of transmission quality.

3. The routing of wires is penalized by the termination resistors positioned in a central region of the board. Generally, this region is densely populated with wires such as CA wires coming back from connectors, wires for CA output signals and DQ output signals of the LR buffers, and the like. There is no wiring space available on a surface layer because pads for mounting DRAMs, passive parts and the like are mounted on the surface layer, and the foregoing signals, generally in a bus form, cannot pass through the surface layer, and therefore pass through an inner layer. Also, since CA signals traveling through the inner layer eventually reach a termination resistor, they once appear on the surface layer through TVH (Thru Via Hole) or BVH (Blind Via Hole).

Since a group of TVH and BVH are regarded as so-called "walls" from the viewpoint of wiring, multiple TVHs and BVHs should not be generally disposed in a region densely populated with wires. However, in LR-DIMM, the termination resistor is only disposed in a region which is densely populated with wires. Since it is generally known that wires narrowly spaced from one another are susceptible to crosstalk, such crowded wires should be avoided for improved transmission quality.

4. Limitations exist in methods for routing outputs from the LR buffers (topology). Due to the positional relationship between LR buffers in LR-DIMM, even if one attempts to modify the wiring structure in order to improve the transmission quality, the only option is a wiring structure which involves discontinuous loads as shown in FIG. 5.

5. Wires are crowded around outputs of the LR buffers because a mixture of input and output CA signals and DQ signals go back and forth there. As is apparent from FIGS. 5 and 6, wires are densely crowded in the LR-DIMM due to a bus which accommodates input/output CA signals that go back and forth around the outputs of the LR buffer, and input/output DQ signals which extend radially. For the reason set forth above, such crowded wires should be avoided.

SUMMARY OF THE INVENTION

The present invention provides LR-DIMM of VLP type that conforms to the LR-DIMM technology currently proposed in JEDEC, and a novel wiring method therefor.

A memory module of the present invention comprises a plurality of DRAMs mounted on a board, two connectors mounted on the board for receiving data, and a buffer device mounted on the board for redriving data applied to the two connectors to supply the data to the plurality of DRAMs, characterized in that:

the buffer device is located near the center of the board on which the two connectors are arranged at both ends thereof, and supplies data from each connector to DRAMs arranged on an opposite side to the connector.

In this event, two buffer devices may be mounted on each of the top and bottom surfaces of the board.

Additionally, the two buffer devices may be mounted substantially at the center of the board.

Alternatively, one buffer device may be mounted substantially at the center of the board.

Also, two said buffer devices may be allotted with DQ[31:0], CB[7:0], DQS[3:0], DQS[12:9], DQS8 and DQS17 and /DQS[3:0], /DQS[12:9], /DQS8 and DQS 17, and DQ[63:32], DQS[7:4], DQS[16:13] and /DQS[7:4], /DQS[16:13] from the connectors, for application to the DRAMs.

Alternatively, one said buffer device may be configured to receive DQ[31:0], CB[7:0], DQS[3:0], DQS[12:9], DQS8 and DQS17 and /DQS[3:0], /DQS[12:9], /DQS8 and DQS 17, and DQ[63:32], DQS[7:4], DQS[16:13] and /DQS[7:4], /DQS[16:13] from the connectors, and to apply the same to the DRAMs.

Also, a DRAM may be arranged on the left side of said buffer device, as viewed from a top surface of the board, for receiving DQ[63:32], DQS[7:4], DQS[16:13] and /DQS[7:4], /DQS[16:13], and a DRAM may be arranged on the right side of said buffer device for receiving DQ[31:0], CB[7:0], DQS[3:0], DQS[12:9], DQS8 and DQS17 and /DQS[3:0], /DQS[12:9], /DQS8 and DQS 17.

Alternatively, a DRAM may be arranged on the left side of said buffer device, as viewed from a top surface of the board, for receiving DQ[63:32], DQS[7:4], DQS[16:13] and /DQS [7:4], /DQS[16:13], and DRAMs may be arranged on the surface of the board opposite to said buffer device and on the right side thereof for receiving DQ[31:0], CB[7:0], DQS[3:0], DQS[12:9], DQS8 and DQS17 and /DQS[3:0], /DQS[12:9], /DQS8 and DQS 17.

Further, the board may be a multi-layer wiring board.

A memory module layout method of the present invention is directed to a memory module which comprises a plurality of DRAMs mounted on a board, two connectors mounted on the board for receiving data, and a buffer device mounted on the board for redriving data applied to the two connectors to supply the data to the plurality of DRAMs. The method is characterized by placing the buffer device near the center of the board on which the two connectors are arranged at both ends thereof, and routing wires such that data from each connector is supplied to DRAMs arranged on an opposite side to the connector.

BRIEF DESCRIPTION OF THE DRAWINGS

FIGS. 11(a), 11(b) are plan views of a third embodiment of the present invention, respectively;
FIGS. 12(a), 12(b) are plan views of a fourth embodiment of the present invention, respectively;
and
FIGS. 13(a), 13(b) are plan views of a fifth embodiment of the present invention, respectively.

EXEMPLARY EMBODIMENTS

Next, embodiments of the present invention will be described with reference to the drawings.

First Embodiment

Figure 7:
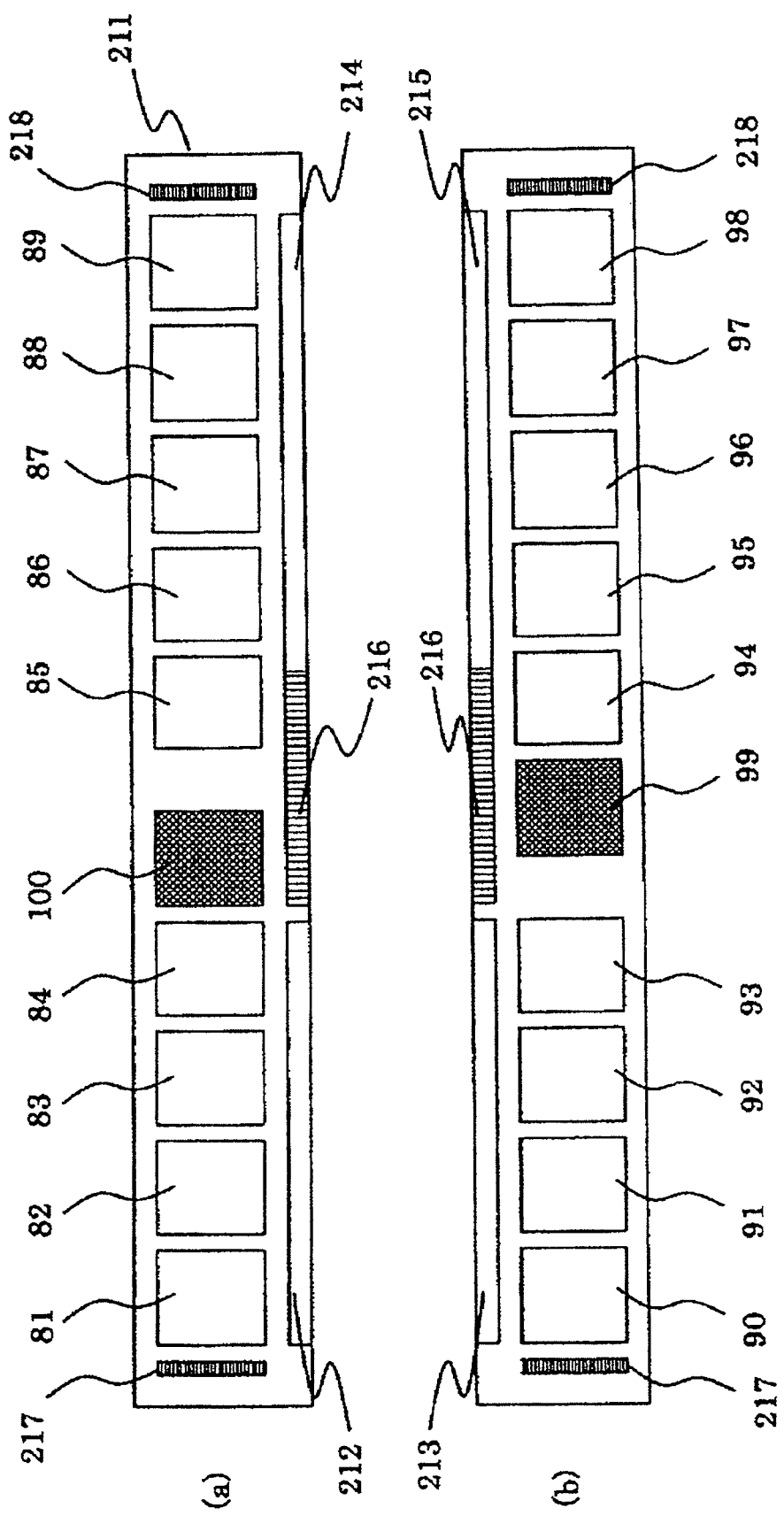
FIGS. 7(a), 7(b) are plan views of a first embodiment of the present invention, respectively.
Figure 8:
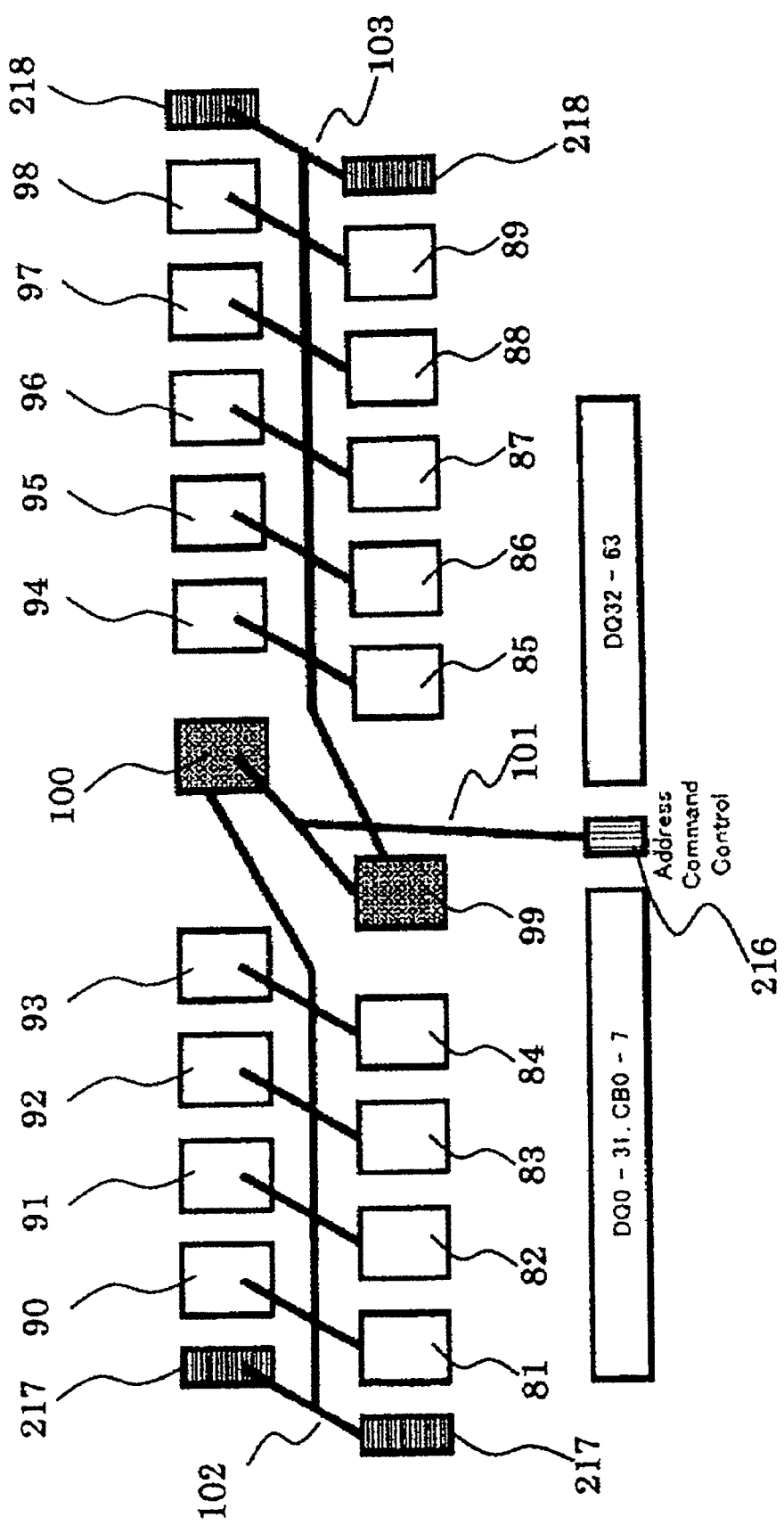
FIG. 8 is a diagram showing a wiring structure of the embodiment shown in FIG. 7.
Figure 9:
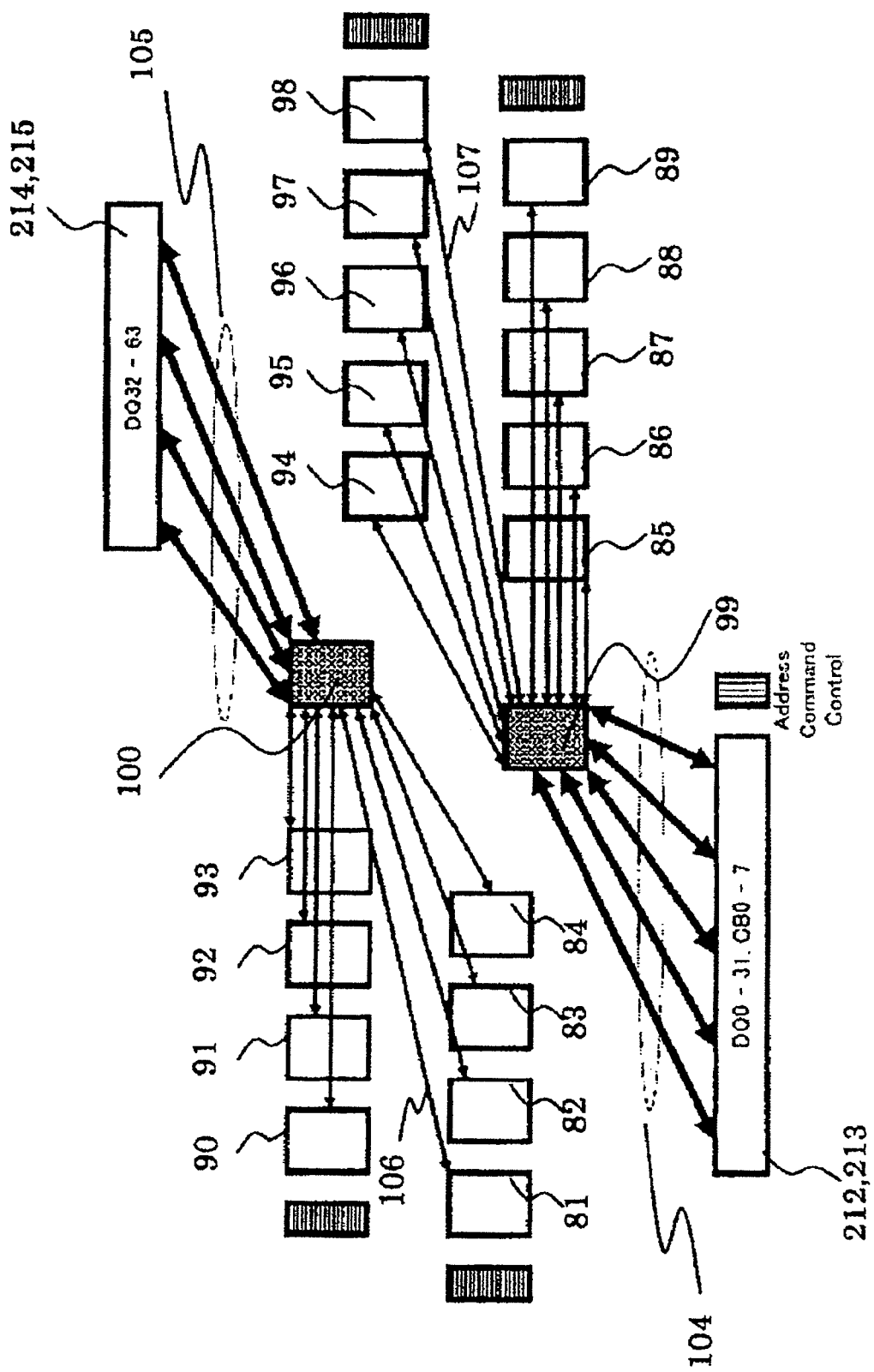
FIG. 9 is a diagram showing a wiring structure of the embodiment shown in FIG. 7.

FIGS. 7(a), 7(b) are plan views of a first embodiment of LR-DIMM of VLP type that conform to the LR-DIMM technology according to the present invention, showing a first surface and a second surface, opposite to the first surface, respectively, and FIGS. 8 and 9 are diagrams showing wiring structures of the LR-DIMM.

The RDIMM of this embodiment comprises board 211 which is a printed circuit board (PCB), and DRAMs 81-98, LR buffers 99, 100, connectors 212-216, and termination resistors 217, 218, all of which are mounted on board 211.

LR buffers 99, 100 are disposed substantially at the same positions on the top and bottom in a central area of board 211. In this event, LR buffer 99 mounted on the first surface has its outputs directed to the right, as viewed from the first surface of board 211.

On the other hand, LR buffer 100, mounted on the second surface, has its outputs directed to the left, as viewed from the second surface of board 211. As a result, LR buffers 99, 100 on the top and bottom surfaces are arranged such that their outputs are directed to the left and right on the top and bottom surfaces, respectively. LR buffers 99, 100 have some of their outputs overlapping on the top and bottom surfaces.

From connectors 212, 213, 40 DQs, 10 DQSs, and 10 /DQSs, represented by DQ group 104, are connected to LR buffer 99. Connectors 214 and 215 are connected to LR buffer 100, by 32 DQs, 8 DQSs, and 8 /DQSs, represented by DQ group 105. This embodiment provides the following advantages.

1. Reduction in Total Wiring Length of Post-CA, and Uniform Distribution of Loads.

FIG. 8 shows the structure of CA wires in the first embodiment of the present invention. CA signal 101 from the connector is applied to LR buffers 99, 100 near the center on the top and bottom surfaces of board 211 after traveling over an extremely short distance. The CA signal applied to LR buffer 99 passes through DRAMs 85-89, 94-98 on the right side, as viewed from the first surface of board 211, and is terminated at termination resistor 218. The CA signal applied to LR buffer 100 passes through DRAMs 84-81, 93-90 on the left side, as viewed from the first surface of the board, and is terminated at termination resistor 7.

As described above, this embodiment significantly simplifies the wiring, thus making it possible to accomplish a reduction in total wiring length and uniform distribution of loads.

2. Avoidance of Crowded Wires Around LR Buffers

According to this embodiment, wires can be readily routed, while avoiding crowded wires, as can be seen from FIGS. 8 and 9, from the fact that signals output from the respective LR buffers are directed only to the left and right, respectively, without overlapping, that wires of CA signals do not turn back, that input DQ signals from the connector do not overlap with output CA signals from the connector, and the like.

3. Simplification of Wiring Structure for Post-CA (Topology can be Varied)

According to this embodiment, as can be seen from the routing of the CA signal shown in FIG. 8, the wiring structure can be simplified for the output CA signals of the LR buffers. Also, when DRAMs are arranged in such a manner as the example shown in FIG. 1 or as in the embodiment shown in FIG. 7, where CA signals are output from register 28 and LR buffers 99, 100, a layout can be implemented to divide wires associated with the CA signals into a bus which connects DRAMs only on the first surface through TVH, BVH and the like, and a bus which connects DRAMs only on the second surface. While such a wiring structure may be referred to as "Y-topology," this embodiment can select a wiring structure from the Fly-by and Y-topologies based the foregoing considerations.

The foregoing advantage is ancillarily provided by this embodiment, whereas the essence of the present invention lies in that a total of 60 outputs, DQ[31:0], CB[7:0], DQS[3:0], DQS[12:9], DQS8, DSQ17, /DQS[3:0], /DQS[12:9], /DQS8, and /DQS17, in the left-hand area of board 211, applied to LR buffer 99 on the first surface are directed to a right-hand area of board 211, and a total of 48 outputs, DQ[32:63], DQS[7:4], DQS[16:13], /DQS[7:4], and /DQS[16:13], in a right-hand area of board 211, applied to LR buffer 100 on the first surface, are directed to a left-hand area of board 211.

Figure 1:
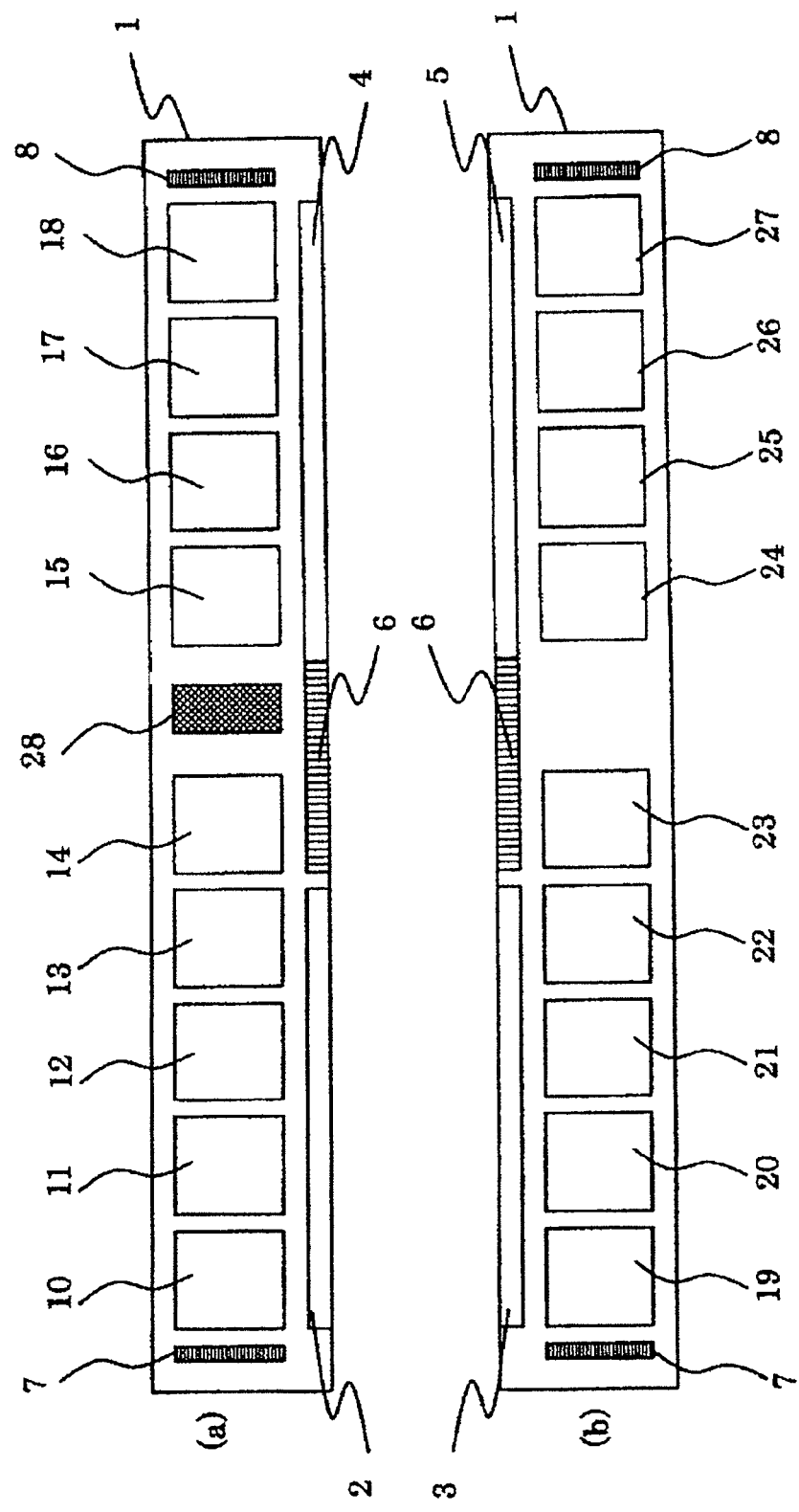
FIGS. 1(a), 1(b) are plan views of RDIMM, respectively.
Figure 2:
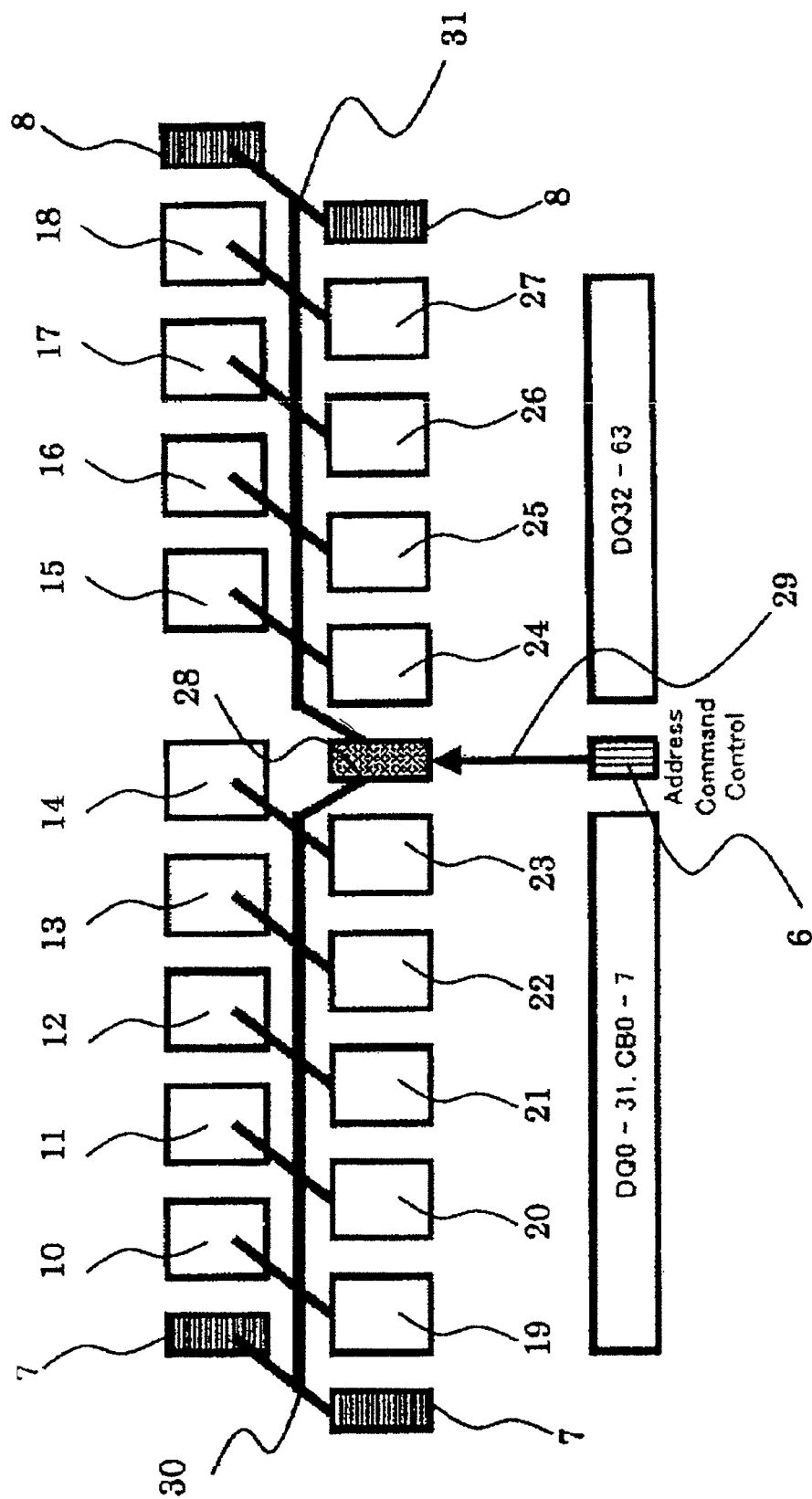
FIG. 2 is a diagram showing a wiring structure of the RDIMM shown in FIG. 1.
Figure 3:
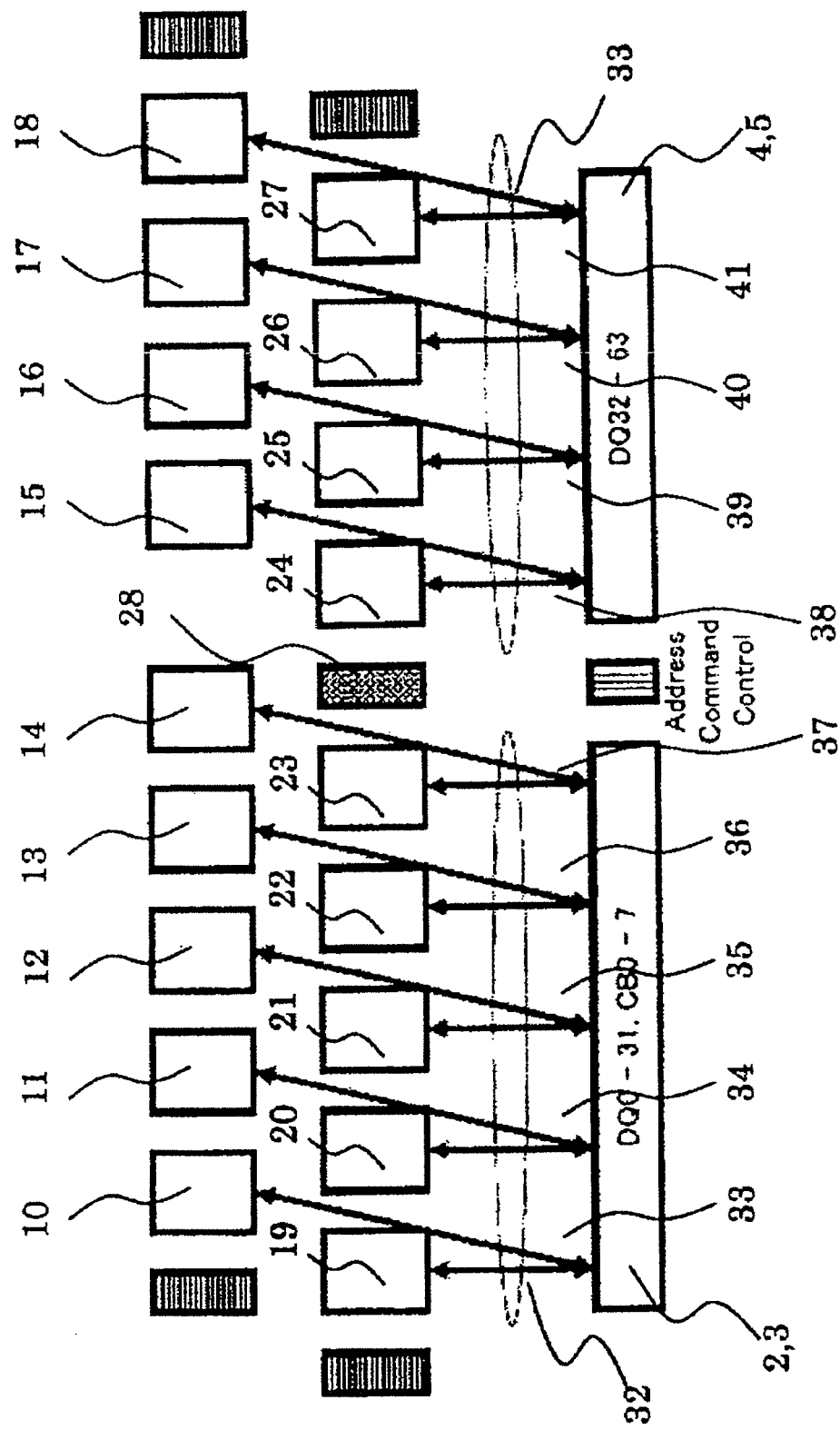
FIG. 3 is a diagram showing a wiring structure of the RDIMM shown in FIG. 1.
Figure 4:
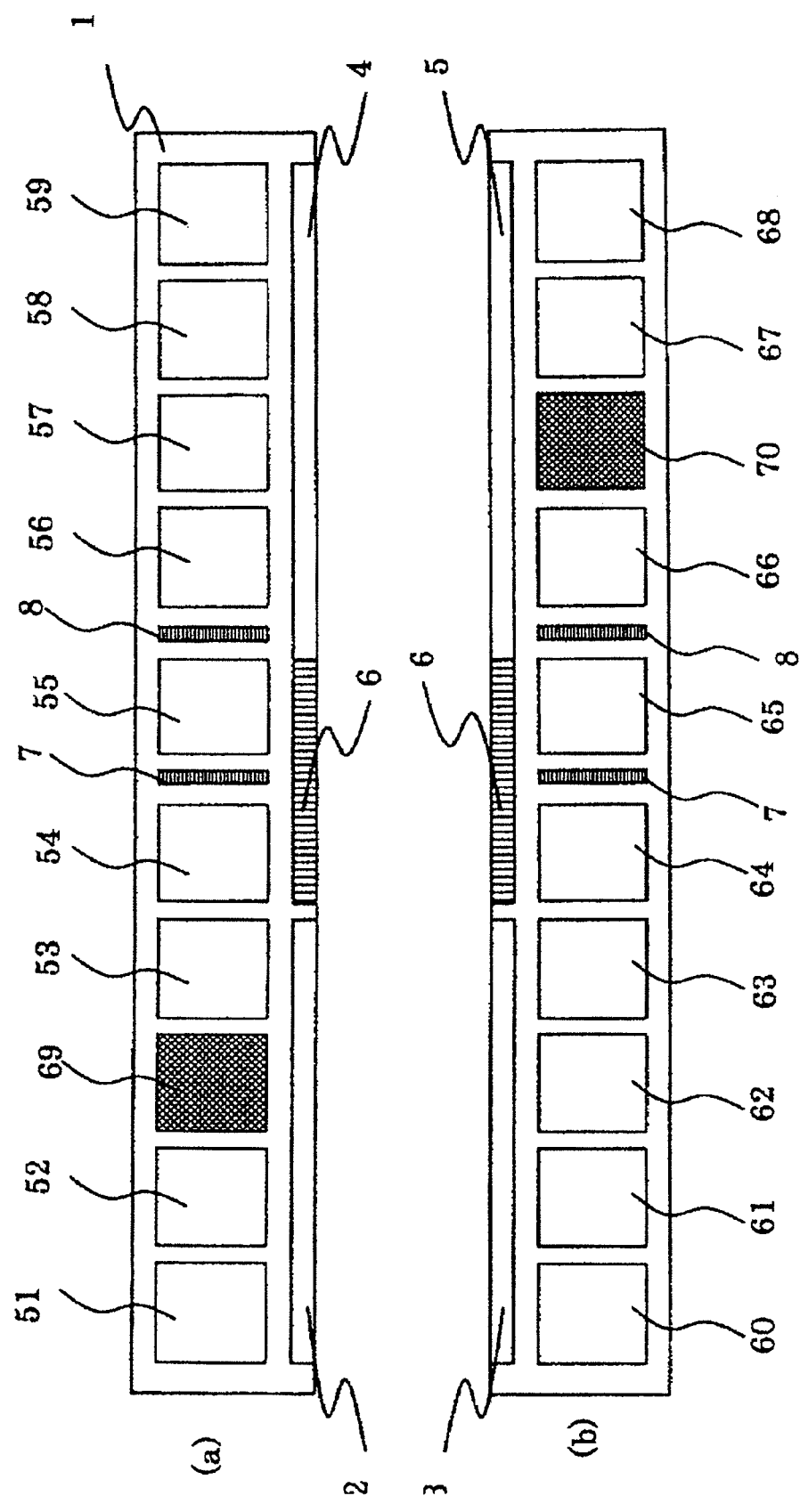
FIGS. 4(a), 4(b) are plan views of LR-DIMM of VLP type, respectively.
Figure 5:
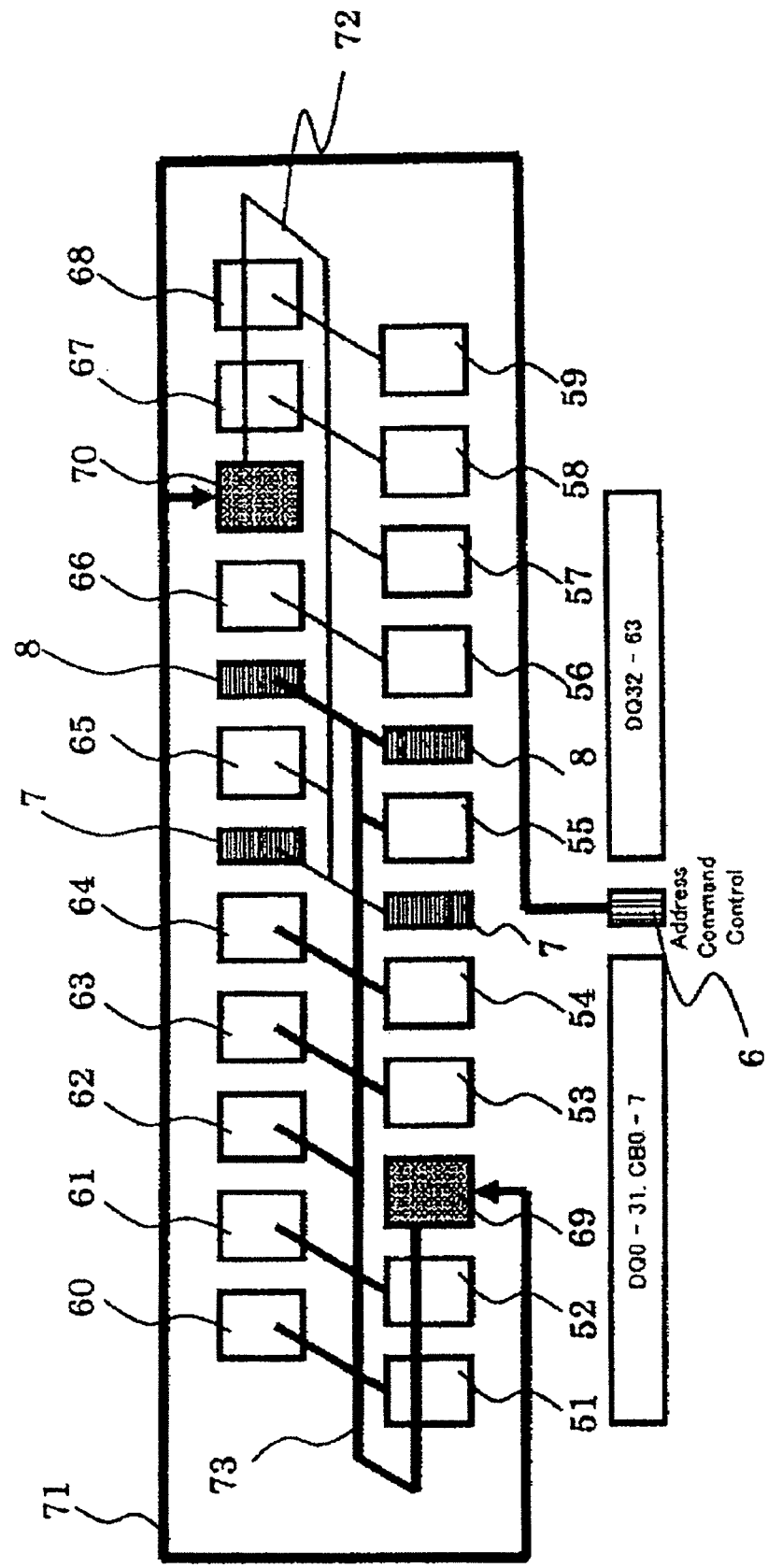
FIG. 5 is a diagram showing a wiring structure of the LR-RDIMM of VLP type shown in FIG. 2.
Figure 6:
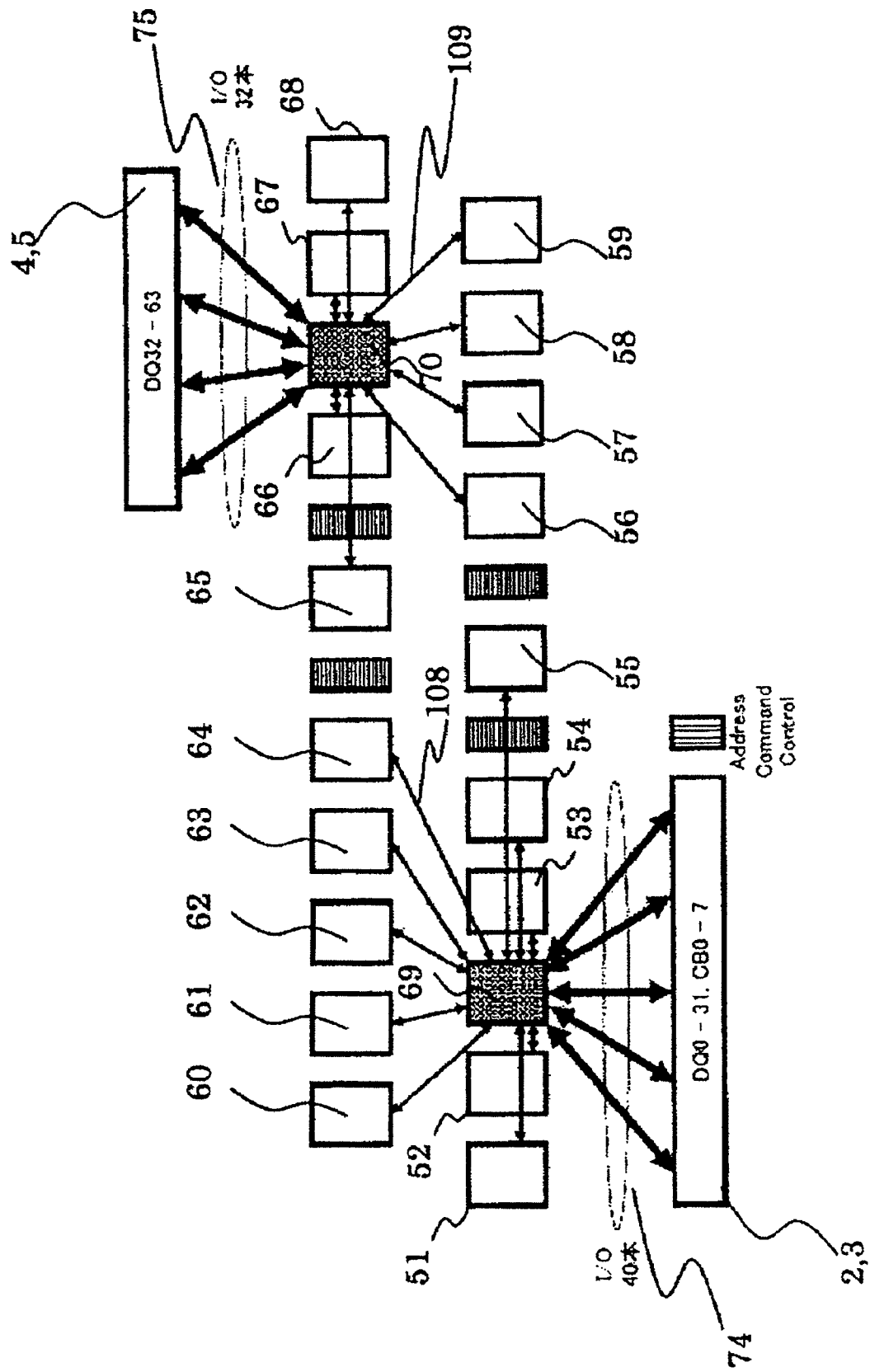
FIG. 6 is a diagram showing a wiring structure of the LR-RDIMM of VLP type shown in FIG. 2.

In the DDR3-RDIMM shown in FIG. 1 and the LR-DIMM shown in FIG. 4, DQ in the "left-hand area of the board," as viewed from the first surface, is generally connected to DRAM in the left-hand area of the board," while DQ in the "right-hand area of the board" is connected to DRAM in the "right-hand area of the board."

However, in the present invention, DQs from connectors 212, 213 in the "left-hand area of the board," as viewed from the first surface, are connected to DRAMs 85-89, 94-98 in the "right-hand area of the board," while DQs from connectors 214, 215 in the right-hand area of the board are connected to DRAMs 84-81, 93-90 in the left-hand area of the board.

Pay attention to the left-hand area of the board for the advantage of the present invention. In comparison with 60 DQs applied from connectors 212, 213 to LR buffer 99, 48 DQs output from LR buffer 100 are those applied from the right-hand area of the board. However, in the right-hand area of the board, 48 DQs are applied from connectors 214, 215 to LR buffer 100, while 60 DQs output from LR buffer 99 are those applied from the right-hand area of the board. This means that the same number of buses are routed in the left-hand and right-hand areas of board 211, showing that the wiring density is made uniform, and that the wiring space is effectively utilized. In the example shown in FIG. 1, when DQ wires provided from the left-hand area of the board are deployed in the left-hand area of the board, a total of 120 wires, i.e., 60 inputs and 60 outputs should be routed. However, in the right-hand area, 96 wires are routed, resulting in a non-uniform wiring density.

Accordingly, this embodiment can ensure a certain degree of freedom for the layout through uniform wiring density, avoid crowded wires around the outputs of the LR buffers, and simplify the structure of CA wires, presumably resulting in minimization of the influence such as cross-talk, which can be caused by densely populated wires, to lead to ensuring adequate margin at higher speeds. (The LR-DIMM of the related art is intended for higher speeds of DQ signals and DQS signals, and thus attempts to place the LR buffers close to the connectors. However, it is thought that, when considering the influence of side effects, the reliability of the transmission quality of the CA and DQ signals, in total, will be degraded.

Second Embodiment

Figure 10:
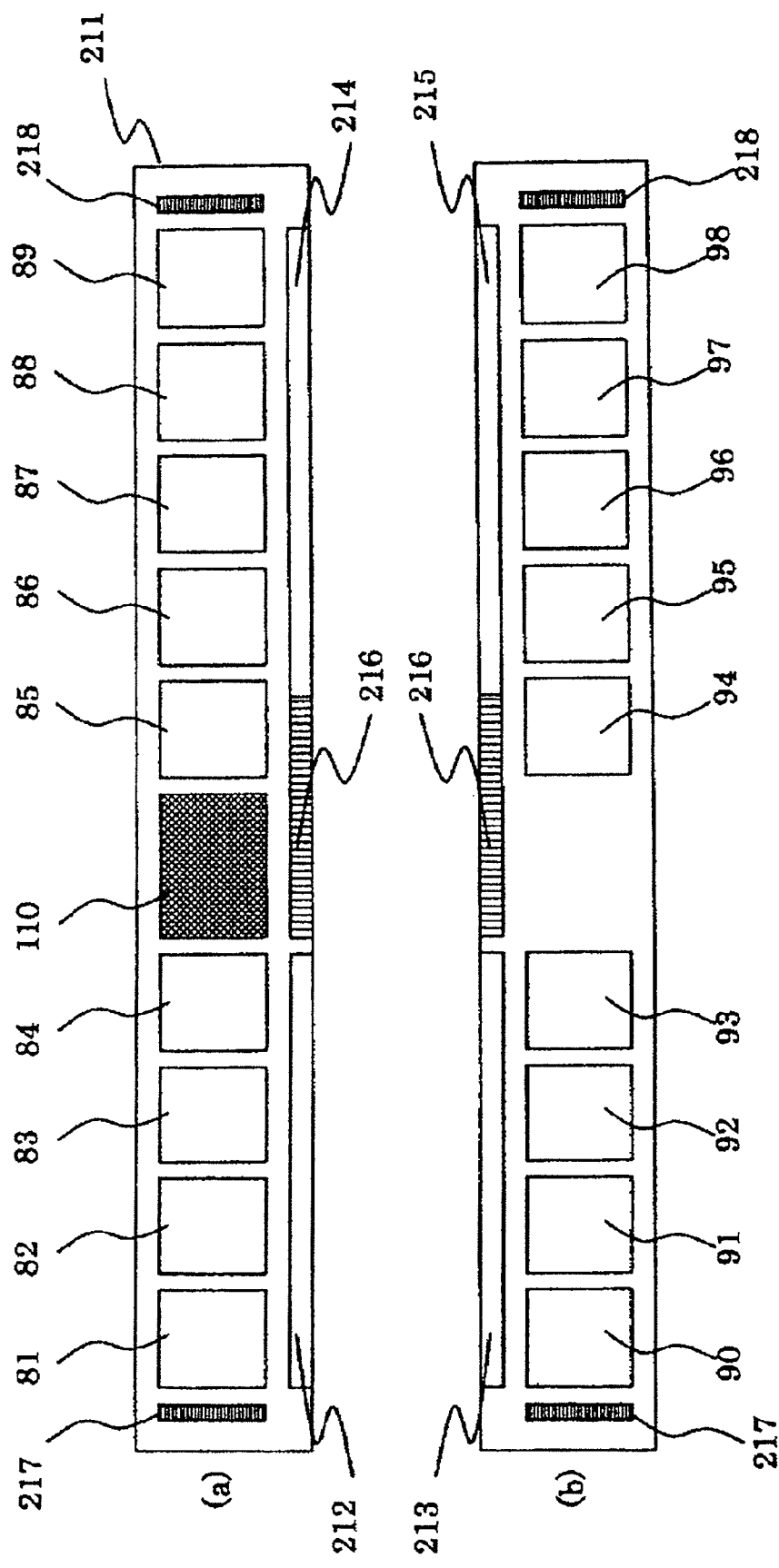
FIGS. 10(a), 10(b) are plan views of a second embodiment of the present invention, respectively.

FIGS. 10(a), 10(b) are plan views of a second embodiment of LR-DIMM of VLP type that conform to LR-DIMM technology according to the present invention, showing a first surface and a second surface, opposite to the first surface, respectively.

The second embodiment employs one LR buffer, while the first embodiment employs two. Since LR buffer 110 is larger in size than the PKG size employed in the first embodiment, 108 DQ and DQS signals can be applied at one time. According to this embodiment, LR buffer 110 is applied with DQ[63:0], DQS[17:0], and /DQS[17:0], and may output, to the right side thereof, as viewed from the top surface of the board, DQ[31:0], CB[7:0], DQS[3:0], DQS[12:9], DQS8 and DQS17 and /DQS[3:0], DQS[12:9], DQS8 and DQS17, and outputs, to the left side thereof, DQ[63:32], DQS[7:4], DQS[16:13] and /DQS[7:4], DQS[16:13]. Here, LR buffer 110 may be mounted on the first surface or on the second surface.

Third Embodiment

FIGS. 11(a), 11(b) are plan views of a third embodiment of LR-DIMM of VLP type that conforms to LR-DIMM technology according to the present invention, showing a first surface and a second surface, opposite to the first surface, respectively.

The third embodiment shows an example in which DRAMs 85 and 94 of the second embodiment are mounted on the side opposite to the side on which LR buffer 111 is mounted. This embodiment uses the connections of DQ outputs from LR buffer 111 in the second embodiment, but may employ different connections. Here, LR buffer 111 may be mounted on the first surface or on the second surface.

Fourth Embodiment

FIGS. 12(a), 12(b) are plan views of a fourth embodiment of LR-DIMM of LP type that conforms to LR-DIMM technology according to the present invention, showing a first surface and a second surface, opposite to the first surface, respectively.

This embodiment develops the standard outer shape from VLP to LP. In this embodiment, LR buffers 112, 113 are vertically arranged on the first surface, and a plurality of DRAMs 114 are arranged side by side in two rows in a similar manner. Likewise, in this embodiment, any of the LR buffers may receive inputs DQ[31:0], CB[7:0], DQS[3:0], DQS[12:9], DQS8, DQS17 and /DQS[3:0], /DQS[12:9], /DQS8 and DQS 17 from connectors (not shown), and connect those to DRAMS located in the right-hand area on the first surface of the board, while the other LR buffer may receive inputs DQ[63:32], DQS[7:4], DQS[16:13] and /DQS[7:4], /DQS [16:13] from the connectors, and connect DQs to DRAMS located in the left-hand area, as viewed from the first surface of the board, as is the case with the first embodiment.

LR buffers 112, 113 may both be mounted on the first surface of the board, or both may be mounted on the second surface. Alternatively, one may be mounted on the first surface, while the other may be mounted on the second surface. The two LR buffers may be replaced by the single LR buffer shown in the second embodiment.

Fifth Embodiment

FIGS. 13(*a*), 13(*b*) are plan views of a fifth embodiment of LR-DIMM of LP type that conforms to LR-DIMM technology according to the present invention, showing a first surface and a second surface, opposite to the first surface, respectively.

In this embodiment, DRAMs 115, 116 shown in the fourth embodiment are mounted on the side of the board opposite to the side on which LR buffer 119 is mounted. LR buffer 119 has similar functions to those of the second embodiment. Information on the connection may be used as it is, or may be varied.

In this embodiment which provides the foregoing configuration, the wiring density is made uniform, and the transmission quality is improved.

What is claimed is:

1. A memory module, comprising:
    a printed circuit board (PCB) of a rectangular shape defined by first and second short sides opposite to each other, and first and second long sides opposite to each other, the module substrate including a first region defined by the first and second long sides and the first short side, a second region defined by the first and second long sides and the second short side and a third region defined between the first and second regions;
    a first set of memory devices provided on the first region of the PCB;
    a second set of memory devices provided on the second region of the PCB;
    a first buffer device provided on the third region of the PCB;
    a second buffer device provided on the third region of the PCB;
    a first set of terminals provided on the first region of the PCB, between the first long side and the first set of memory devices;
    a second set of terminals provided on the second region of the PCB, between the first long side and the second set of memory devices;
    a third set of terminals provided on the third region of the PCB, between the first and second sets of terminals;
    a first group of wires provided between the first set of terminals and the first buffer device to transfer a first data therebetween;
    a second group of wires provided between the second set of terminals and the second buffer device to transfer a second data therebetween:
    a third group of wires provided between the first and second buffer devices;
    a fourth group of wires provided between the third group of wires and the third set of terminals to transfer a command signal, an address signal, a control signal and a clock signal therebetween;
    a fifth group of wires provided between the first buffer and the second set of memory devices; and
    a sixth group of wires provided between the second buffer device and the first set of memory devices.

2. The memory module as claimed in claim 1,
    wherein the PCB includes a first main surface and a second main surface;
    wherein the first buffer device is provided on the first main surface and the second buffer is provided on the second main surface.

3. The memory module as claimed in claim 2,
    wherein the first buffer device overlaps the second buffer device.

4. The memory module as claimed in claim 1,
    wherein the PCB includes a first main surface and a second main surface;
    wherein the first and second buffer devices are provided on the first main
    surface.

5. The memory module as claimed in claim 4,
    wherein the first and second buffer devices are arranged in series between the first and second long sides.

6. The memory module as claimed in claim 1, further comprising:
    a first termination resistor provided between the first short side and a memory device located adjacent to the first short side among the first set of memory devices and connected to the sixth group of wires, and
    a second termination resistor provided between the second short side and a memory device located adjacent to the second short side among the second set of memory devices and connected to the fifth group of wires.

7. The memory module as claimed in claim 1,
    wherein the fifth set of wires includes a set of first data wires to transfer the first data between the first buffer device and the second set of memory devices;
    wherein the sixth set of wires includes a set of second data wires to transfer the second data between the second buffer device and the first set of memory devices; and
    wherein a number of the first wires and first data wires is identical to a number of the second wires and second data wires.

8. The memory module as claimed in claim 1,
    wherein the memory module is a load reduce dual inline memory module (LR-DIMM).

9. The memory module as claimed in claim 8,
    wherein the LR-DIMM is a very low profile (VLP) type.

10. A memory module, comprising:
    a module substrate of a rectangular shape defined by first and second short sides opposite to each other, and first and second long sides opposite to each other, the module substrate including a first region defined by the first and second long sides and the first short side, a second region defined by the first and second long sides and the second short side;

a first set of memory devices provided on the first region of the module substrate;

a second set of memory devices provided on the second region of the module substrate;

a first buffer device provided on the module substrate;

a second buffer device provided on the module substrate;

a first set of terminals provided on the first region of the module substrate, between the first long side and the first set of memory devices;

a second set of terminals provided on the second region of the module substrate, between the first long side and the second set of memory devices;

a first group of wires provided between the first set of terminals and the first buffer device to transfer a first data therebetween;

a second group of wires provided between the second set of terminals and the second buffer device to transfer a second data therebetween;

a third group of wires provided between the first buffer device and the second set of memory devices to transfer the first data therebetween; and a fourth group of wires provided between the second buffer device and the first set of memory devices to transfer the second data therebetween.

11. The memory module as claimed in claim 10, further comprising:

a third set of terminals provided on the third region of the module substrate, between the first and second sets of terminals;

a fifth group of wires provided between the first and second buffer devices;

a sixth group of wires provided between the fifth group of wires and the third set of terminals to transfer at least one of a command signal, an address signal, a control signal and a clock signal therebetween;

a seventh group of wires provided between the first buffer device and the second set of memory devices to transfer at least the one therebetween; and an eighth group of wires provided between the second buffer device and the first set of memory devices to transfer at least the one therebetween.

12. The memory module as claimed in claim 10, wherein the module substrate includes a first main surface and a second main surface;

wherein the first buffer device is provided on the first main surface and the second buffer device is provided on the second main surface.

13. The memory module as claimed in claim 10, wherein the module substrate includes a first main surface and a second main surface;

wherein the first and second buffer devices are provided on the first main surface.

14. The memory module as claimed in claim 11, further comprising:

a first termination resistor provided between the first short side and a memory device located adjacent to the first short side among the first set of memory devices and connected to the eighth group of wires, and a second termination resistor provided between the second short side and a memory device located adjacent to the second short side among the second set of memory devices and connected to the seventh group of wires.

15. The memory module as claimed in claim 10, wherein a number of the first wires and fourth wires is identical to a number of the second wires and third wires.

16. The memory module as claimed in claim 10, wherein the memory module is a load reduce dual inline memory module of a very low profile type.

17. A memory module, comprising:

a module substrate of a rectangular shape defined by first and second short sides opposite to each other, and first and second long sides opposite to each other, the module substrate including a first region defined by the first and second long sides and the first short side, a second region defined by the first and second long sides and the second short side;

a first set of memory devices provided on the first region of the module substrate;

a second set of memory devices provided on the second region of the module substrate;

a first buffer device provided on the module substrate;

a second buffer device provided on the module substrate;

a set of terminals provided on the module substrate to receive at least one of a command signal, an address signal, a command signal and a clock signal;

a first group of wires provided between the first and second buffer devices;

a second group of wires provided between the first group of wires and the set of terminals;

a third group of wires provided between the first buffer device and the second set of memory devices to transfer at least the one therebetween; and an fourth group of wires provided between the second buffer device and the first set of memory devices to transfer at least the one therebetween.

18. The memory module as claimed in claim 17, wherein the module substrate includes a first main surface and a second main surface;

wherein the first buffer device is provided on the first main surface and the second buffer is provided on the second main surface.

19. The memory module as claimed in claim 17, wherein the module substrate includes a first main surface and a second main surface;

wherein the first and second buffer devices are provided on the first main surface.

20. The memory module as claimed in claim 17, wherein the memory module is a load reduce dual inline memory module of a very low profile type.

* * * * *